United States Patent [19]

Chen et al.

[11] Patent Number: 5,759,287
[45] Date of Patent: Jun. 2, 1998

[54] METHOD OF PURGING AND PASSIVATING A SEMICONDUCTOR PROCESSING CHAMBER

[75] Inventors: Aihua Chen; Robert A. Chapman, both of Sunnyvale, Calif.

[73] Assignee: Applied Materials, Inc., Santa Clara, Calif.

[21] Appl. No.: 667,555

[22] Filed: Jun. 21, 1996

Related U.S. Application Data

[63] Continuation of Ser. No. 441,239, May 15, 1995, Pat. No. 5,536,330, which is a continuation of Ser. No. 84,938, Jun. 30, 1993, abandoned.

[51] Int. Cl.⁶ .................. B08B 5/04; B08B 9/00
[52] U.S. Cl. .............. 134/21; 134/22.1; 134/22.18; 134/30; 134/37; 34/410; 34/412
[58] Field of Search .............. 134/21, 22.1, 22.18, 134/30, 31, 37; 15/304; 34/410, 412

[56] References Cited

U.S. PATENT DOCUMENTS

| | | | |
|---|---|---|---|
| 3,880,681 | 4/1975 | Sifre et al. | 148/175 |
| 4,017,330 | 4/1977 | Aidlin et al. | 134/21 |
| 4,045,253 | 8/1977 | Banks et al. | 148/250 |
| 4,432,808 | 2/1984 | Heubusch | 134/3 |
| 4,590,100 | 5/1986 | Hearst | 427/327 |
| 4,828,760 | 5/1989 | Chung et al. | 134/21 X |
| 5,238,503 | 8/1993 | Phenix et al. | 134/37 |
| 5,536,330 | 7/1996 | Chen et al. | 134/21 |

OTHER PUBLICATIONS

Singer, P., "Pump-down to Ultrahigh Vacuum in Minutes, Not Hours", *Semiconductor International*, Jul., 1992, p. 34.

*Primary Examiner*—Jill Warden
*Assistant Examiner*—Saeed Chaudhry
*Attorney, Agent, or Firm*—John Taylor; Leslie Weise; Robert W. Mulcahy

[57] ABSTRACT

A method for purging and passivating a vacuum chamber suitable for use in the production of integrated circuit structures on semiconductor wafers. The method includes flowing a heated, non-reactive gas, such as argon gas, through the chamber for purposes of decontaminating the chamber and subsequently filling the chamber with a selected gas such as nitrogen to passivate the chamber for storage or shipping purposes.

4 Claims, 1 Drawing Sheet

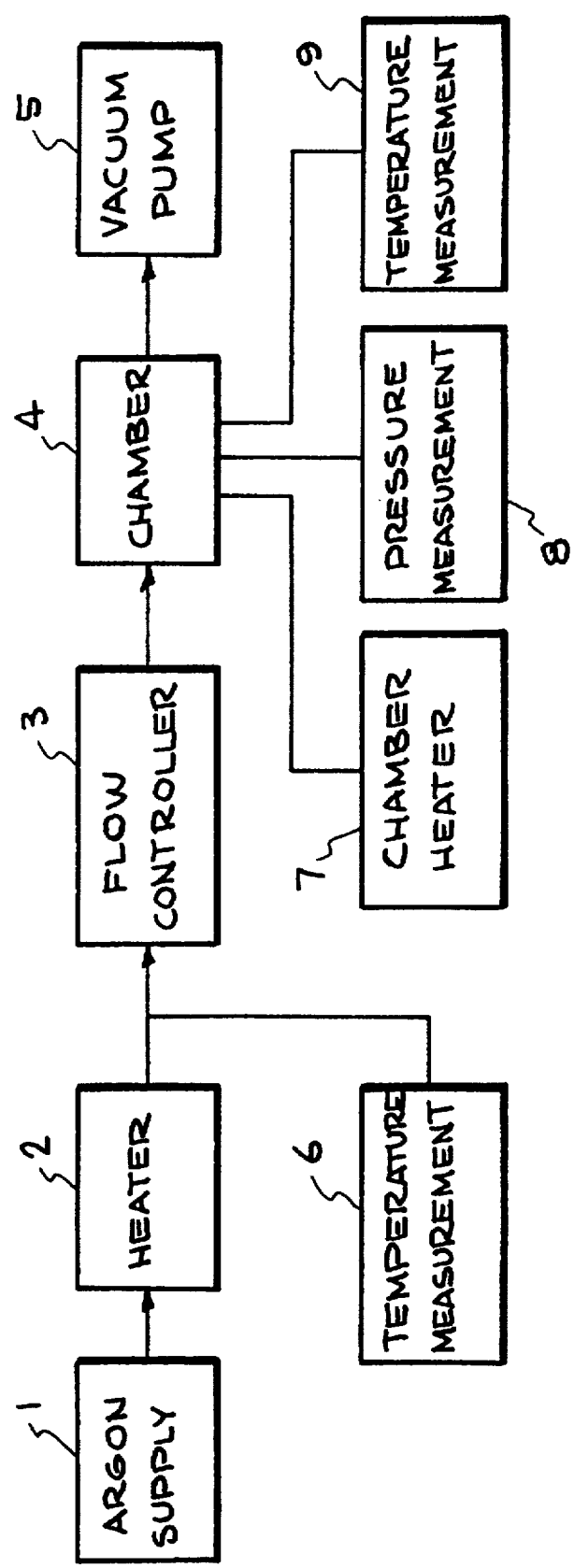

METHOD OF PURGING AND PASSIVATING A SEMICONDUCTOR PROCESSING CHAMBER

This application is a Continuation of prior U.S. application Ser. No. 08/441,239 filed on May 15, 1995, now U.S. Pat. No. 5,536,330, which application is a continuation of Ser. No. 08/084,938 filed on Jun. 30, 1993, now abandoned.

BACKGROUND OF THE INVENTION

1. Field of the Invention

This invention relates to the purging and pumping of a vacuum chamber, and more particularly to a method of pumping to ultra-high vacuum, a vacuum chamber suitable for use in the manufacture of integrated circuit structures.

2. Description of the Related Art

In the prior art, considerable effort has been devoted to providing ultra-high vacuum capability in thin film processing equipment, for example, for use in the formation of integrated circuit structures on semiconductor wafers. Ultra-high vacuum is important for obtaining and sustaining low levels of contamination during production of the integrated circuit structures. However, in pumping to ultra-high vacuum, for example, when PVD processing is practiced, it is important to minimize the period of time required because such time is non-production time. Further, when testing vacuum chamber equipment for ultra-high vacuum, it is desirable to predict the integrity of the vacuum chamber during the pump to ultra-high vacuum levels to avoid wasted pumping time.

Various methods have been used for purging or decontaminating vacuum systems, including electropolishing, baking at elevated temperatures, photon-stimulated desorption and glow discharge cleaning using oxygen or noble gas. However, these approaches are not without problems. For example, baking is time consuming because a molecule released from a surface in the chamber is not efficiently removed to the chamber exit. Upon release, the desorbed molecule can take what is referred to as a random path where it can strike other surfaces in the chamber with the chance of becoming readsorbed. On the other hand, glow discharge cleaning can result in further contamination by absorption of the cleaning gases into the chamber surfaces.

These gases are emitted later which leads to contamination. Also, it has been reported that glow discharge cleaning may not be uniform, particularly in complicated chamber geometry.

Other systems have been reported which can reach ultra-high vacuum in a matter of minutes. Such systems employ expensive mirror finishes to minimize contaminants and water adsorption, glow-discharge cleaning using super-dry nitrogen gas, and double turbomolecular pumps. However, fabrication of such systems is very costly and, accordingly, would be impractical.

Thus, there is a great need for an economical method for purging a vacuum chamber that would permit pumping to an ultra-high vacuum in a relatively short time, thereby ensuring a contaminant-free environment.

SUMMARY OF THE INVENTION

It is an object of the invention to provide a method for removing contaminants from a vacuum chamber utilizing a heated non-reactive purging gas.

Yet, it is another object of the invention to provide a method for removing contaminants using a combination of such heated non-reactive purging gas and sub-atmospheric diffusion to entrain and remove desorbed contaminants in the heated gas.

These and other objects will become apparent from a reading of the specification and claims appended hereto.

In accordance with these objects there is provided an improved method for purging a vacuum chamber suitable for use in the production of integrated circuit structures on semiconductor wafers. The method comprises providing the chamber to be purged and flowing a heated, non-reactive gas, such as argon gas, through the chamber. The non-reactive gas should be heated to a temperature of at least about 90° C. Further, the chamber should be heated to maintain it at a temperature of at least about 90° C. while flowing the gas therethrough. Flowing the non-reactive gas through the chamber absorbs released impurities or contaminants and efficiently sweeps them from the chamber in the gas.

BRIEF DESCRIPTION OF THE DRAWING

The sole FIGURE is a schematic outline of the equipment used to carry out the process of the invention.

DETAILED DESCRIPTION OF THE INVENTION

The invention comprises a method of purging and pumping of a vacuum chamber to remove adsorbed contaminants therefrom prior to pumping the chamber to ultra-high vacuum. Such a vacuum chamber is suitable for use, for example, in the manufacture of integrated circuit structures and other semiconductor devices on semiconductor wafers; or for use with any material, fabrication, and/or processing requiring ultra-high vacuum.

Referring now to the FIGURE a source 1 of a non-reactive gas such as argon is shown which flows through a heater 2 and a flow controller 3 to a chamber 4, such as a vacuum chamber, which is to be purged of impurities or contaminants. A vacuum pump 5, which may actually comprise several pumps, is also connected to chamber 4.

The supply of gas is heated by heater 2 prior to entering vacuum chamber 4. Normally, the gas is heated to a temperature of at least 90° C. before entering vacuum chamber 4. For purposes of releasing adsorbed contaminant molecules on inside surfaces of chamber 4, it is preferred that the gas be heated to a temperature in the range of about 150° C. to about 250° C. before entering chamber 4, with a typical temperature being about 150° C. Heating the argon gas prior to entering chamber 4 may be accomplished by the use of either inductive heaters or resistance heaters comprising heater 2.

Flow controller 3 may comprise a gas flow meter placed in the stream of gas flowing to chamber 4 to maintain a preset level of flow of heated gas to chamber 4.

As shown in the FIGURE, the temperature of the gas flowing to the vacuum chamber may be monitored at 6, for example, by a thermocouple which regulates the heat input to the gas so as to maintain it at a preset level.

Further, while the heated gas may be used as the source of heat being applied to the vacuum chamber, it is preferred that additional heat be added to the vacuum chamber by an independent source comprising chamber heater 7. Thus, for purposes of providing or transferring additional heat to vacuum chamber 4, independent heaters, such as lamps or chamber heaters or gas-line heaters, may be used. The independent heaters aid in maintaining the gas temperature in the chamber typically in the range of 90° C. to 250° C. while sweeping the non-reactive gas therethrough.

Heating the chamber, as well as heating the non-reactive gas, is important because of the energy required to break the bonding energy that holds or bonds the contaminating molecule to the surface of the chamber. It is this bonding energy which must be overcome before the molecule is released into the inside of the chamber. While such energy may be imparted to the contaminating molecule adsorbed on the chamber wall by virtue of the argon molecules hitting the chamber wall, this is not efficient because of the length of time required to remove all of the adsorbed molecules. Similarly, heating the chamber with chamber heaters as noted earlier, for example, is not as efficient as using heated gas in combination with the independent heaters. Thus, the first step of the present process is to ensure the efficient release of the contaminating molecule from the inside surfaces of the chamber. This is accomplished by imparting to the chamber a level of energy sufficient to quickly and efficiently break the bonding energy of the contaminating molecules.

As shown in the FIGURE, for purposes of regulating the heat in the chamber, the chamber temperature may be measured at 9 with a thermocouple so as to control the heat input from the independent heaters.

As noted earlier, the chamber and internal parts may be baked after assembly of the vacuum system, but prior to introducing or flowing argon gas therethrough. That is, the system is heated by the heaters, while evacuating the chamber, but prior to any gas flow into the chamber. Such baking is normally designed to dislodge surface contaminants that are adsorbed to the material constituting the chamber. However, such baking is not efficient in removing such dislodged contaminants from the vacuum chamber inside surfaces because of the lack of efficiency in removing such molecules, resulting in recombination of the dislodged contaminant with the surface, i.e., readsorption. In fact, molecules desorbed by baking frequently become adsorbed in another region of the chamber due to the random path the desorbed molecules can take before exiting. Furthermore, the amount of energy needed for desorption of contaminants often cannot be supplied solely by such baking.

Therefore, in accordance with the invention, the second aspect of the process for efficiently purging the vacuum chamber of contaminants in accordance with the invention involves preventing such contaminant molecules from becoming re-adsorbed on the vacuum chamber surfaces after they have been released. This is accomplished by the heated gas stream flowing through the vacuum chamber where the heated gas contacts the released contaminant molecules. The heated gas flowing or sweeping through the chamber essentially prevents the contaminant molecules from being re-adsorbed on the inside surfaces of the chamber. Further, the flow of gas takes the contaminant molecules efficiently to the exit of the chamber with only minimal opportunity to re-adsorb.

The heated gas can be injected under pressure into the vacuum chamber and permitted to exit therefrom at atmospheric pressure. This maintains the chamber under a positive pressure. Or, the gas may be injected under pressure to the vacuum chamber and removed at sub-atmospheric pressure, together with desorbed contaminants, by the pumping system, in which case the chamber may still be purged under a positive pressure. Preferably, however, the heated gas is introduced into the vacuum chamber at relatively high, but subatmospheric, pressures and then removed at subatmospheric pressure, together with desorbed contaminants, by the pumping system. It is preferred to operate the process so as to maintain the chamber under a sub-atmospheric pressure for several reasons, including minimizing the escape of any toxic molecules that may be present on the inside chamber surfaces. Thus, while the heated gas is being flowed through the chamber, the chamber is preferably maintained at a pressure of from about 50 to about 750 Torr as measured at 8, as shown in the FIGURE.

This pressure may be maintained by a roughing vacuum pump system which may comprise one or several roughing pumps. The chamber pressure may be measured by a pressure gauge and relayed to the vacuum pump for purposes of maintaining the desired chamber pressure. In the preferred embodiment of the invention, the roughing vacuum pump is operated continuously while gas is being flowed through the chamber. Maintaining a sub-atmospheric pressure aids flow of gas through the chamber and consequently aids in the removal of released contaminant molecules.

The flow of heated gas into the chamber is maintained at a level, for example, equivalent to a minimum flow of at least about 5 standard cubic centimeters per second (sccm) into a 5 liter chamber, and preferably equivalent to a flow into a 5 liter chamber ranging from about 20 sccm to about 150 sccm to ensure a sufficient gas flow to accomplish the desired sweeping of the desorbed contaminants out of the chamber.

While reference has been made herein to the use of heated argon as a purging gas, it will be understood that other gases, including other inert gases, can be used. Such gases can include, for example, nitrogen or neon, as well as combinations of such gases. However, the use of argon is preferred.

In operation of the process, the heated non-reactive gas is pumped through the vacuum chamber for a predetermined period, following which the chamber is tested, while hot, to determine whether or not it is capable of reaching and maintaining a high vacuum. This period may be determined empirically based on previously tested vacuum chambers (of the same size) capable of being pumped to ultra-high vacuum. Analysis of the partial pressures for oxygen or nitrogen, or any other common gases, may also be used in determining the pump down time required prior to testing. Then, after pumping or flowing the non-reactive gas through the vacuum chamber for the predetermined period of time, the flow of heated gas to the chamber is stopped. The pressure or vacuum of the chamber is checked, i.e., the chamber is checked for the presence of contaminants, by evacuating the chamber, while the chamber is still hot, to an ultra-high vacuum, preferably in the range of from about $4\times10^{-7}$ to about $6\times10^{-7}$ Torr, and typically about $5\times10^{-7}$ Torr.

If the pressure is high compared to previously tested chambers at this pressure, this is indicative of a leakage problem with the chamber. Thus, further purging would not cleanse the chamber of oxygen or nitrogen, or other common gases, and further pumping would be futile. Alternatively, after the partial pressure check, if the readings correspond or are not unusually high compared to previously tested chambers, this indicates that the vacuum chamber does not leak and conforms to manufacturing specifications. The vacuum chamber may then be pumped to an ultra-high vacuum. Thus, long periods of pumping time on defective chambers are avoided. It will be seen that this method has the advantage of markedly shortening the time for which chambers are pumped by testing to find defective chambers before attempting to pump to ultra-high vacuum.

Pumping to ultra high vacuum may be achieved by the first use of a roughing pump, as previously mentioned, followed by a pump down using a cryogenic or turbo pump, or an equivalent high vacuum pumping system. The chamber may be pumped down to $5\times10^{-9}$ Torr, for example, to achieve ultra-high vacuum.

After the vacuum chamber has been pumped to an ultra-high vacuum, it may be filled with a selected gas such as nitrogen for storage or shipping purposes. Nitrogen is particularly useful for this purpose because it bonds more strongly with vacuum chamber surfaces than argon. The use of nitrogen is beneficial because its presence prevents water molecules from bonding with the chamber walls. Nitrogen has a bonding strength of about 40 milli-Joules/mole (mJ/mole), and argon has a bonding strength of about 20 mJ/mole. Thus, water molecules which have a bonding strength of about 100 mJ/mole do not have the same ability to displace nitrogen from the chamber walls as they would to displace argon.

The following example is still further illustrative of the invention.

EXAMPLE

For this example, a vacuum chamber, such as a chamber used in physical vapor deposition, can be used such as, for example, a 5 liter vacuum chamber contained in an Applied Materials Endura™ multichamber semiconductor processing system available from Applied Materials, Inc., Santa Clara, Calif. A source of argon gas can be attached to the chamber. Two vacuum pump stages would be attached to the chamber in order to pump the chamber to ultra-high vacuum. The first vacuum pump stage would be a roughing pump stage, which could comprise one or more roughing pumps, such as a DC-25 BCS vane pump, available from Leybold, Inc. or a WSU-151 Roots Blower, also available from Leybold, Inc.; and the second pumping stage would be a cryogenic pump, such as a CTI CRYO-TORR8F available from CTI, Inc.

The argon gas can be heated to a temperature of about 150° C. before being introduced to the chamber. The flow rate of the argon gas to the chamber would be at least about 5 sccm and sufficient, in combination with the pumping system, to maintain a pressure within the chamber of from about 50 to about 750 Torr. The roughing pump can be operated to provide a pressure in the chamber of 750 Torr while the argon gas is being flowed through it. Heaters, such as halogen lamps, can be applied either to the inside or the outside of the chamber to maintain the chamber at a temperature of about 97° C. After 1–2 hours, the flow of argon gas to the chamber can be stopped and the chamber pumped to $5\times10^{-7}$ Torr. Then, the partial pressure of the gas leaving the vacuum chamber can be analyzed. If the partial pressure of oxygen is higher than about $5\times10^{-8}$ Torr and the partial pressure of nitrogen is higher than $2\times10^{-7}$ Torr, the vacuum chamber can be considered to have a leakage problem. Thus, attempting pumping to an ultra-high vacuum is not necessary. If, however, the partial pressure of oxygen and the partial pressure of nitrogen are less than the above specified amounts, the chamber can be predicted to pump to an ultra-high vacuum of $5\times10^{-9}$ Torr upon reaching ambient temperature.

From the above, it will be seem that the present invention provides an improved method for purging vacuum chambers which method can markedly shorten the time spent in attempting to pump the chambers to an ultra-high vacuum.

Having thus described the invention, what is claimed is:

1. A process for purging a vacuum chamber suitable for use in production of integrated circuit structures on semiconductor wafers comprising:
   (a) providing a vacuum chamber to be purged, said chamber having an interior surface;
   (b) simultaneously:
      (i) flowing a non-reactive gas through said vacuum chamber from a first point in said chamber; and
      (ii) pumping out of said chamber, through an exit spaced from said first point, a non-reactive gas heated to a temperature of at least 90° C.;
   (c) maintaining said chamber at a temperature of at least 90° C. and at least a vacuum level in a range of about 50 Torr to about 750 Torr while flowing said heated non-reactive gas through said chamber, thereby sweeping impurities from said chamber and substantially preventing reabsorbtion of molecules that have been desorbed from the interior surface of said chamber; and
   (d) filling the chamber with a gas having a relatively high bonding strength so as to attach to the interior surface of the chamber and substantially prevent water molecules from attaching thereto.

2. The process of claim 1 wherein the high bonding strength gas is dry nitrogen.

3. A process for purging a vacuum chamber suitable for use in production of integrated circuit structures on semiconductor wafers comprising:
   (a) heating a vacuum chamber to a temperature of at least 90° C., said chamber having an interior surface;
   (b) thereafter flowing through said heated vacuum chamber argon gas heated to a temperature of at least 90° C.;
   (c) removing said heated gas from said chamber while flowing said heated argon gas through said chamber at a rate sufficient to maintain a pressure below 750 Torr, Thereby sweeping impurities from said chamber and substantially preventing reabsorbtion of molecules that have been desorbed from the interior surface of said chamber; and
   (d) filling the chamber with a gas having a relatively high bonding strength so as to attach to the interior surface of the chamber and substantially prevent water molecules from attaching thereto.

4. The process of claim 3 wherein the high bonding strength gas is dry nitrogen.

* * * * *